United States Patent [19]

Hulbert

[11] 4,282,497

[45] Aug. 4, 1981

[54] FREQUENCY MODULATOR HAVING LINEARIZED OPERATION

[75] Inventor: Anthony P. Hulbert, Southampton, England

[73] Assignee: Plessey Handel und Investments AG, Zug, Switzerland

[21] Appl. No.: 54,920

[22] Filed: Jul. 5, 1979

[51] Int. Cl.³ .............................................. H03C 3/08
[52] U.S. Cl. ...................................... 332/19; 331/23; 455/126
[58] Field of Search ..................... 332/18, 19; 455/75, 455/76, 113, 126; 331/23

[56] References Cited

U.S. PATENT DOCUMENTS

| | | | |
|---|---|---|---|
| 3,659,060 | 4/1972 | Wolff et al. ...................... | 455/113 X |
| 4,117,422 | 9/1978 | Hunt ................................. | 332/19 X |
| 4,125,817 | 11/1978 | Bagdasarjanz et al. ............... | 332/19 |

Primary Examiner—Siegfried H. Grimm
Assistant Examiner—Edward P. Westin
Attorney, Agent, or Firm—Fleit & Jacobson

[57] ABSTRACT

A frequency modulator comprising an oscillator the output frequency of which is dependent upon the amplitude of a modulating signal, modulating signal control means via which the modulating signal is fed to the oscillator to produce a corresponding frequency modulation on the output signal from the oscillator, a discriminator responsive to the frequency modulation for producing a corresponding amplitude signal, and a comparator responsive to the corresponding amplitude signal and to the modulating signal for providing a control signal which is fed back to control the gain provided by the signal control means so as to maintain constant the amplitude of the amplitude signal with respect to the modulating signal, whereby operation of the modulator is linearized.

7 Claims, 8 Drawing Figures

FREQUENCY MODULATOR HAVING LINEARIZED OPERATION

This invention relates to frequency modulators.

Frequency modulators normally comprise an oscillator responsive to an amplitude variable signal for producing a corresponding frequency variable signal. One problem with such modulators is that the frequency deviation produced by a given amplitude variation can vary with the frequency of operation and/or with temperature and aging. It is a object of the present invention to provide a frequency modulator in which such variations are significantly reduced.

According to the present invention a frequency modulator comprises an oscillator the output frequency of which is dependent upon the amplitude of a modulating signal, modulating signal control means via which the modulating signal is fed to the oscillator to produce a corresponding frequency modulation on the output signal from the oscillator, discriminator means responsive to the frequency modulation for producing a corresponding amplitude varying signal, and comparator means responsive to the corresponding amplitude varying signal and to the modulating signal for providing a control signal which is fed back to control the gain or attenuation provided by the signal control means so as to tend to maintain constant the amplitude of the amplitude varying signal with respect to the modulating signal, whereby operation of the modulator is linearized.

The signal control means may be an amplifier the gain of which is controlled by the control signal.

Thus it will be appreciated that linear operation of the modulator is produced by a servo control feedback loop which operates to linearize operation of the modulator so that non linear characteristics of the oscillator are compensated for by gain changes in the amplifier via which the modulating signal is fed to the oscillator.

The discriminator means may comprise a pulse counting discriminator.

The comparator means may comprise a signal comparator, the output from the discriminator being filtered and fed to the signal comparator for comparison with the modulating signal and a phase sensitive detector, the signal comparator being arranged to feed the phase sensitive detector which is fed also with the modulating signal, via a limiter, the output signal from the phase sensitive detector being fed to control the gain of the amplifier via an integrator.

Alternatively the comparator means may comprise an inverter and a phase sensitive detector, the output of the discriminator being combined with a sample of the modulating signal derived via the inverter, the combined signal being fed via a filter to the phase sensitive detector which is fed also with the modulation signal via a limiter, the output of the phase sensitive detector being integrated to produce the control signal.

The oscillator may be a digital oscillator in which the modulating signal is fed to a variable frequency oscillator the carrier frequency of which is controlled by a signal derived from a phase detector which provides for the variable frequency oscillator a carrier frequency correction signal in the presence of a phase difference between a signal derived from a reference frequency source and a signal derived from the variable frequency oscillator via divider means.

The divider means may comprise the serial combination of a fixed divider and a variable divider the discriminator means being fed with a sample of the frequency modulated output signal from the oscillator via the fixed divider.

A frequency modulator according to the present invention may form part of the synthesiser of a radio transmitter or of a radio transceiver.

Some exemplary embodiments of the invention will now be described with reference to the accompanying drawings in which;

FIG. 2 is a generally schematic block diagram of an alternative form of frequency modulator; and, wherein

Figure 1:
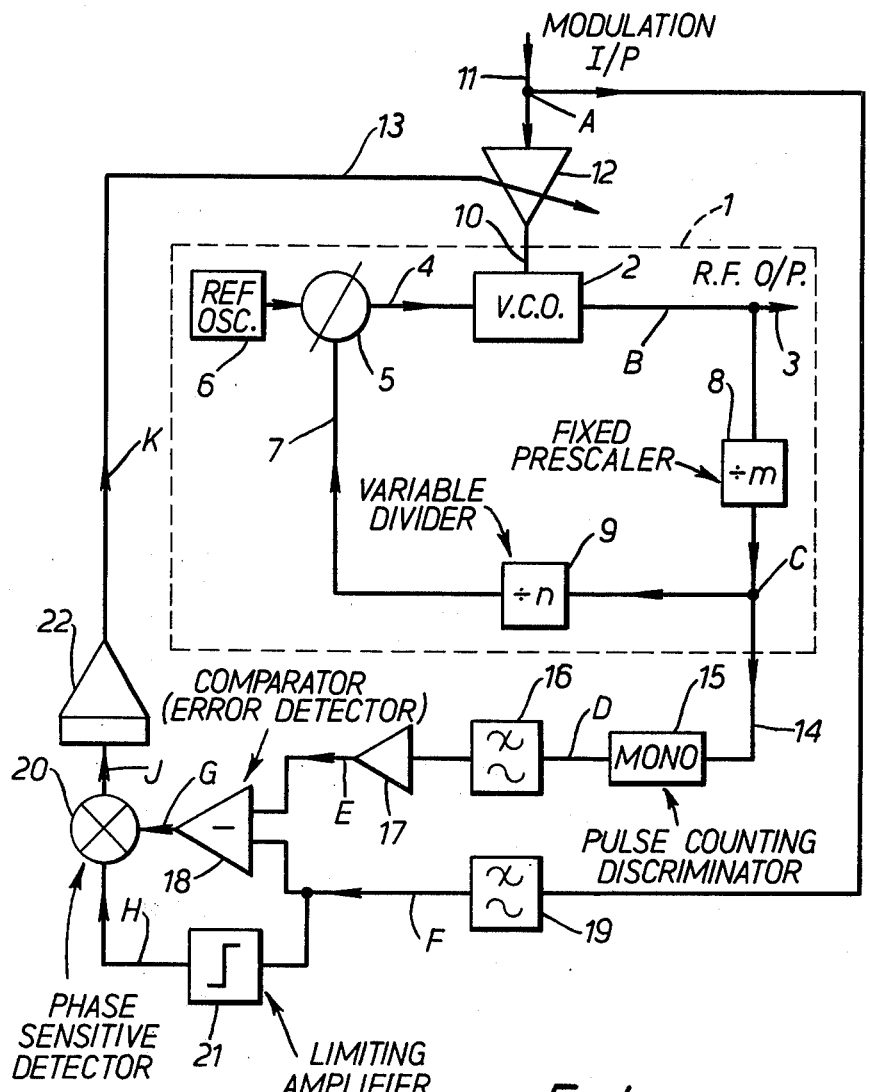
FIG. 1 is a generally schematic block diagram of a frequency modulator.

Referring now to FIG. 1 the modulator comprises an oscillator as shown within broken line 1 which includes a variable frequency oscillator 2 which provides an output signal on line 3 and the carrier frequency of which is controlled by a d.c. feedback control signal fed thereto on line 4. The feedback control signal is derived by means including a phase detector 5 which receives on the one hand a reference signal from a master oscillator 6 and on the other hand a feedback signal on line 7 via the serial combination of a fixed divider 8 and a variable divider 9, the dividers being fed with an output signal from the variable frequency oscillator 2. In order to modulate the output signal on line 3 a modulation signal is applied to the variable frequency oscillator 2 via line 10.

In practice one of the problems with frequency modulators is that due to non linearity in the characteristics of the frequency control elements, which might be variable capacity diodes, to which the control signal 10 is fed, a non-linear modulation characteristic can result. The effect of this non-linearity is that at one end of the frequency band covered by the variable frequency oscillator, a given voltage change on the line 10 may produce a frequency swing at the output terminal 3 which is significantly different from the swing produced by the same voltage at the other end of the band. The frequency swing produced by the variable frequency oscillator for a given voltage change on line 10 may also vary with temperature and ageing.

In order to linearize operation of the oscillator 1 modulation is fed to the line 10 from an input modulation line 11 via an amplifier 12 the gain of which is controlled in accordance with a d.c. control signal fed to the amplifier via line 13. The control signal carried by the line 13 is produced by comparing the modulation signal on line 11 with an amplitude variating signal corresponding to the frequency modulation on line 14 at the output of divider 8 and phase detecting and integrating the result of the comparison. The amplitude varying signal is produced by feeding the signal on the line 14 to a pulse counting discriminator 15 and via a low pass filter 16 and an amplifier 17 to one input port of a comparator 18. The other input port of the comparator 18 is fed with the modulating signal via a low pass filter 19. The comparator 18 feeds one input port of a phase sensitive detector 20 the other input port of which is fed with the modulating signal via the filter 19 and a limiter 20 the output of the detector 20 being integrated in integrator 22 to provide the control signal.

The gain of the amplifier 17 is present so that the signals fed to the comparator 18 are normally the same. However, if as the frequency of the variable frequency oscillator 2 changes the amplitude of the signal fed from the amplifier 17 to the comparator 18 changes as compared with the modulating signal fed thereto via the filter 19 then an output signal will be fed to the phase sensitive detector 20. Thus an output signal from the phase sensitive detector 20 will be produced which is fed via the integrator 22 to provide the control signal 13 for controlling the gain of the amplifier 12. The gain of the amplifier 12 is controlled by the control signal in a sense such that the signals fed to the comparator 18 tend to be the same. The output of the discriminator 15 tends to be undesirably noisy however the use of the phase sensitive detector renders the control signal sensibly unperturbed by this.

Figure 3:
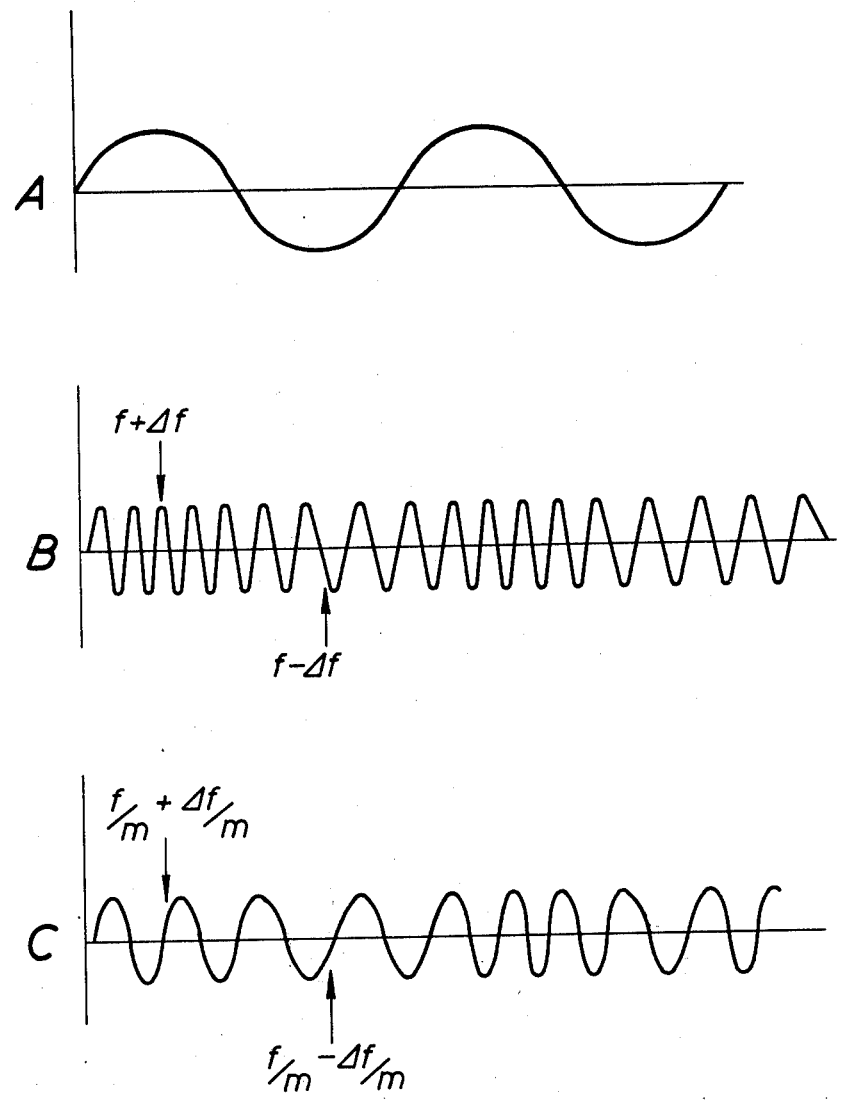
FIGS. 3A to 3F are waveform diagrams illustrating operation of the modulator described with reference to FIG. 1.
Figure 3:
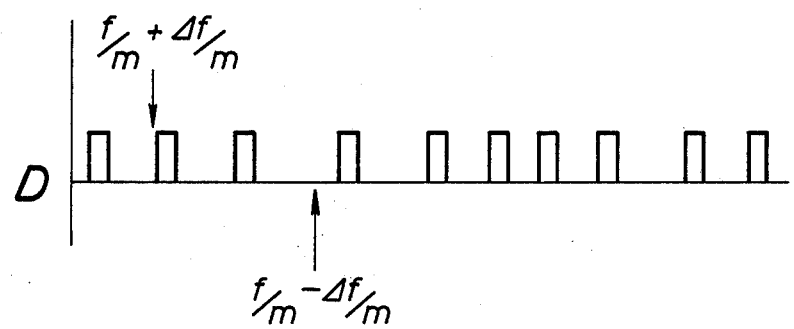
Figure 3:
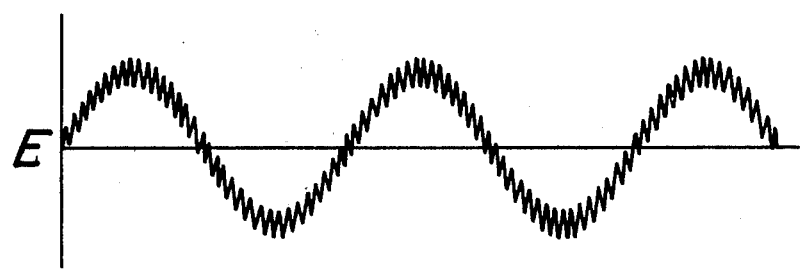
Figure 3:
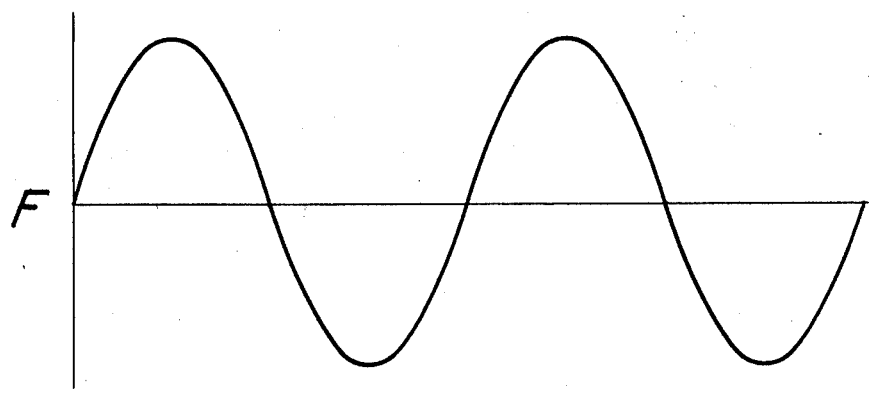
Figure 3:
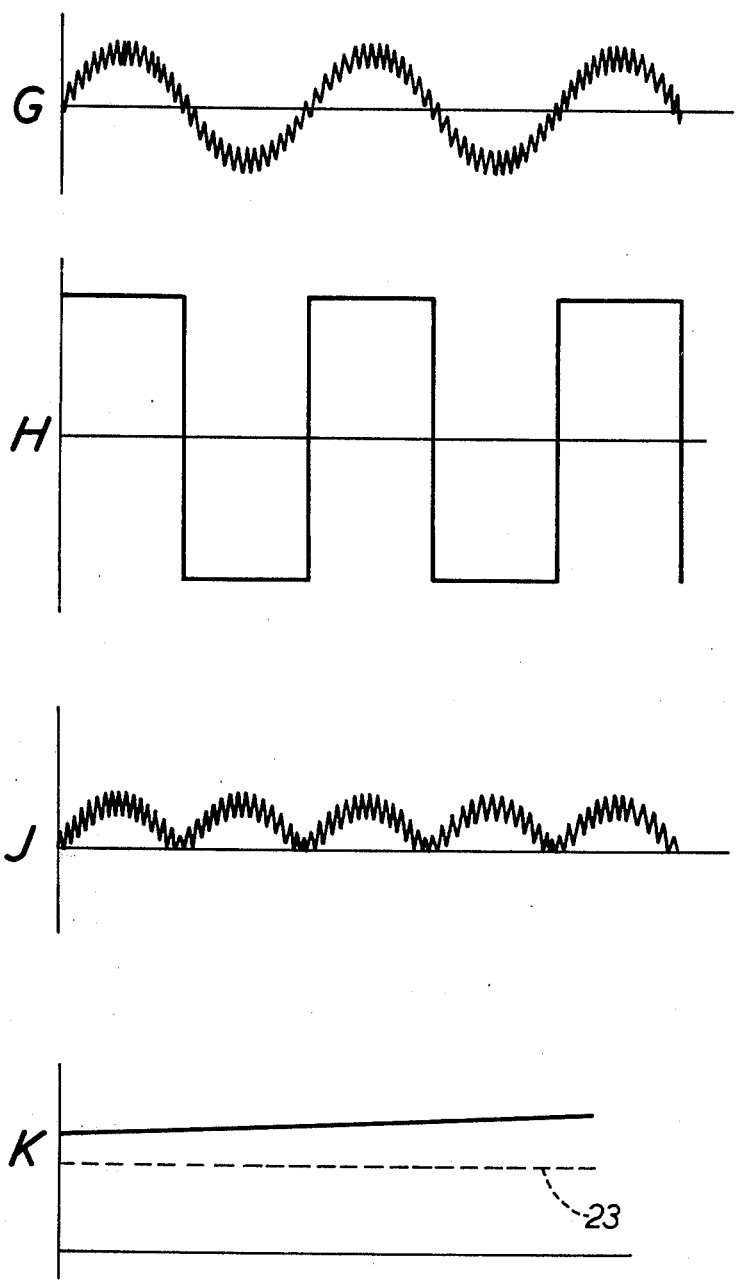

Operation of the circuit just before described might be better understood if reference is made to the waveform diagrams FIGS. 3A to 3F. Referring now to FIG. 3 the waveform A is the modulation waveform which appears on line 11. A corresponding frequency modulation is produced on the output line 3 having frequency deviations of $F+\Delta_F$ and $F-\Delta_F$ where F is the frequency of the variable frequency oscillator. The waveform which appears at the output of the fixed divider 8 is the waveform C as shown in FIG. 3 in which due to the operation of the divider 8 the frequency deviation is $F/M+(\Delta/M) F$ at one extreme and $F/M-(\Delta/M) F$ at the other extreme where M is the division factor of the divider 8. FIG. 3D shows the waveform at the output of the pulse counting discriminator 15. The frequency of the pulses vary between $F/M+(\Delta/M) F$ $F/M-(\Delta/M)$ F as shown. The length of each pulse D is constant and therefore the pulses may conveniently be produced by a monostable multivibrator. FIG. 3E shows the waveform at the output of the amplifier 17 which is in phase with the signal at the output of the filter 19 shown in FIG. 3F. The waveform shown in FIG. 3G is produced at the output of the comparator 18 and will change through 180° as the amplitude of the signal in waveform 3E changes so as to be greater or less than the amplitude of the signal in waveform F. When the signals fed to the comparator are the same i.e. when the signal of waveform E equals the signal of waveform F, then the output from the comparator 18 will be zero. FIG. 3 H shows the signal at the output of the limiter 21 and FIG. 3J shows the waveform at the point J at the output of the phase sensitive detector 20. The waveform of FIG. 3J may take the form of a full wave rectified waveform as shown or the form of a half wave rectified waveform in dependence upon the type of phase sensitive detector used. When the input signals applied to the comparator 18 and as shown in waveforms FIG. 3E and 3F are equal then the amplitude of the waveform FIG. 3J will be zero. Output signals from the Integrator 22 will be as shown in FIG. 3K but will tend to the nominal level as indicated by the broken line 23 which is the condition which will obtain when the waveform FIG. 3J is zero.

Figure 2:
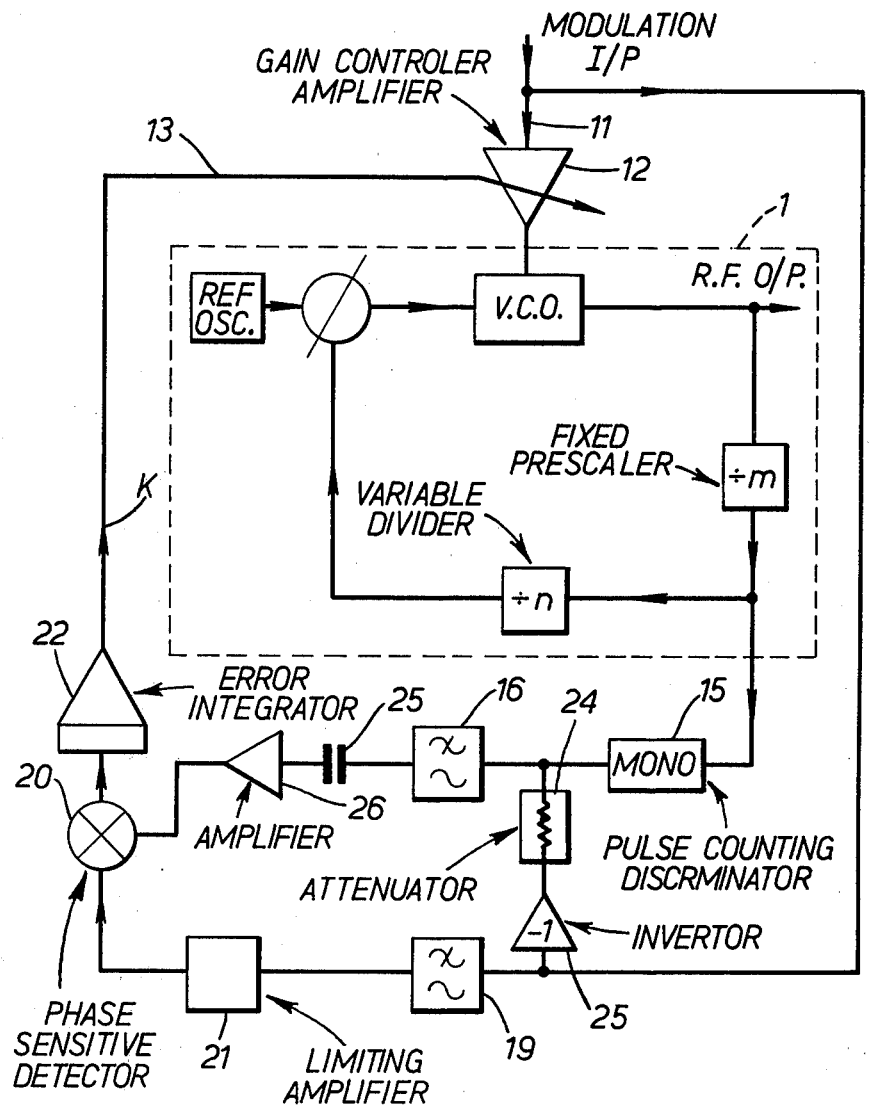

As an alternative to the arrangement just before described with reference to FIG. 1 the arrangement shown in FIG. 2 may be utilized wherein corresponding parts of the modulator bear the same numerical designations. In the arrangement of FIG. 2 a signal from the line as well as being fed to the filter 19 is fed also to the filter 16 via an attenuator 24 and a phase inverter 25. The attentuator 24 is chosen so that a signal fed from the filter 16 via a blocking capacitor 25 and an amplifier 26 to the phase detector 20 is zero under nominal operating conditions. The phase detector 20 is fed as shown in FIG. 1 via the limiting amplifier 21 and feeds the error integrator 22 which provides the control signal on line 13 for the gain controlled amplifier 12. Thus in the arrangement of FIG. 2 if the output from the amplifier 26 is other than zero, a signal will be presented at the input of the phase detector 20 and an appropriate control signal will be fed back to the gain controlled amplifier 12.

A modulator according to the present invention may be utilized in a transmitter or in a transceiver. It may also find applications in very broad band synthesizers, since in such synthesizers the use of a very linear modulator has significant advantages.

What we claim is:

1. A frequency modulator comprising:
   an oscillator having an output frequency which is dependent upon the amplitude of a modulating signal,
   modulating signal control means for receiving a modulating signal and for gain-controlling or attenuating said modulating signal so as to provide an output to the oscillator and to produce a corresponding frequency modulation on the output signal from the oscillator,
   discriminator means responsive to the frequency modulation for producing a corresponding amplitude varying signal,
   comparator means for comparing the amplitude varying signal from the discriminator means with the modulating signal to provide a comparison output,
   phase sensitive detector means for receiving said modulating signal and said comparison output, and responsive thereto for performing a phase detection operation so as to provide a control signal, and
   integrator means for receiving and integrating said control signal so as to provide an integrated control signal, said integrated control signal being provided to said modulating signal control means so as to control the gain or attenuation provided by the modulation signal control means and so as to maintain constant the amplitude of the amplitude varying signal with respect to the modulating signal, whereby operation of the frequency modulator is linearized.

2. A frequency modulator as claimed in claim 1, wherein the modulating signal control means comprises an amplifier having a gain which is controlled by the integrated control signal.

3. A frequency modulator as claimed in claim 2, wherein the discriminator means comprises a pulse counting discriminator.

4. A frequency modulator as claimed in claim 3, comprising a limiter and filter via which the modulating signal is provided to the phase sensitive detector means.

5. A frequency modulator as claimed in claim 4, wherein the comparator means comprises an inverter, the amplitude varying signal from said discriminator means being combined with a sample of the modulating signal derived via the inverter, the combined signal being provided via a filter to the phase sensitive detector means.

6. A frequency modulator as claimed in claim 4, wherein the oscillator comprises a variable frequency oscillator to which the modulating signal is provided, said modulator comprising a further phase detector for providing a frequency correction signal to control said variable frequency oscillator, a reference frequency source for providing a reference frequency signal, and divider means for dividing said output frequency of said variable frequency oscillator to derive a divider output signal, said frequency correction signal being provided to the variable frequency oscillator in the presence of a phase difference between the reference frequency signal and said divider output.

7. A frequency modulator as claimed in claim 6, wherein the divider means comprises the serial combination of a fixed divider and a variable divider, the discriminator means being provided with a sample of the frequency modulated output signal from the oscillator via the fixed divider.

* * * * *